United States Patent
Manabe et al.

(10) Patent No.: US 8,212,901 B2
(45) Date of Patent: Jul. 3, 2012

(54) BACKSIDE ILLUMINATED IMAGING SENSOR WITH REDUCED LEAKAGE PHOTODIODE

(75) Inventors: Sohei Manabe, San Jose, CA (US); Satyadev Nagaraia, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 841 days.

(21) Appl. No.: 12/205,746

(22) Filed: Sep. 5, 2008

(65) Prior Publication Data

US 2009/0201395 A1 Aug. 13, 2009

Related U.S. Application Data

(60) Provisional application No. 61/027,353, filed on Feb. 8, 2008.

(51) Int. Cl.
*H04N 3/14* (2006.01)
(52) U.S. Cl. ....................................................... 348/294
(58) Field of Classification Search .................. 348/294, 348/308; 257/292, 294
See application file for complete search history.

(56) References Cited

U.S. PATENT DOCUMENTS

| | | | | |
|---|---|---|---|---|
| 3,793,022 A | * | 2/1974 | Land et al. | 430/220 |
| 4,740,824 A | * | 4/1988 | Yano et al. | 257/444 |
| 6,504,178 B2 | * | 1/2003 | Carlson et al. | 257/86 |
| 6,960,795 B2 | * | 11/2005 | Rhodes | 257/215 |
| 7,196,314 B2 | * | 3/2007 | Rhodes | 250/214.1 |
| 7,498,650 B2 | * | 3/2009 | Lauxtermann | 257/460 |
| 7,737,520 B2 | * | 6/2010 | Kanbe et al. | 257/447 |
| 2007/0218578 A1 | | 9/2007 | Lee et al. | |

* cited by examiner

*Primary Examiner* — Thomas K Pham
*Assistant Examiner* — Vipin Patel
(74) *Attorney, Agent, or Firm* — Blakely Sokoloff Taylor & Zafman LLP

(57) ABSTRACT

A backside illuminated imaging sensor includes a semiconductor having an imaging pixel that includes a photodiode region, an insulator, and a silicide reflective layer. The photodiode region is formed in the frontside of the semiconductor substrate. The insulation layer is formed on the backside of the semiconductor substrate. The transparent electrode formed on the backside of the insulation layer. The transparent electrode allows light to be transmitted through a back surface of the semiconductor substrate such that when the transparent electrode is biased, carriers are formed in a region in the backside of the semiconductor substrate to reduce leakage current. ARC layers can be used to increase sensitivity of the sensor to selected wavelengths of light.

18 Claims, 4 Drawing Sheets

BACKSIDE ILLUMINATED IMAGING SENSOR WITH REDUCED LEAKAGE PHOTODIODE

CROSS-REFERENCE TO RELATED APPLICATION

This application claims the benefit of U.S. Provisional Application No. 61/027,353, filed on Feb. 8, 2008, the contents of which are incorporated herein by reference.

TECHNICAL FIELD

This disclosure relates generally to imaging sensors, and in particular but not exclusively, relates to backside illuminated imaging sensors.

BACKGROUND INFORMATION

Many semiconductor imaging sensors today are frontside illuminated. That is, they include imaging arrays that are fabricated on the frontside of a semiconductor wafer, where light is received at the imaging array from the same frontside. However, frontside illuminated imaging sensors have many drawbacks, one of which is a relatively limited fill factor.

Backside illuminated imaging sensors are an alternative to frontside illuminated imaging sensors and address the fill factor problems associated with frontside illumination. Backside illuminated imaging sensors typically include imaging arrays that are fabricated on the front surface (or frontside) of the semiconductor wafer, but receive light through a back surface of the wafer. However, to detect light from the backside, the silicon wafer on the backside is relatively thin. Color filters and micro-lenses can be included on the back surface of the wafer in order to improve the sensitivity of the backside illuminated sensor. The thickness of the wafer may also be reduced in order to improve the sensitivity to light (especially lower wavelengths). However, higher sensitivity typically results in higher optical crosstalk. For example, as the semiconductor wafer is thinned, light can more easily pass through the wafer and light intended for one pixel might be reflected within the image sensor to other pixels that were not intended to receive the light. Thus, improving sensitivity and reducing optical crosstalk can improve the signal quality of a backside illuminated sensor.

BRIEF DESCRIPTION OF THE DRAWINGS

Non-limiting and non-exhaustive embodiments of the invention are described with reference to the following figures, wherein like reference numerals refer to like parts throughout the various views unless otherwise specified.

DETAILED DESCRIPTION

Embodiments of a Backside Illuminated Imaging Sensor with Reduced Leakage Photodiode are described herein. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1:
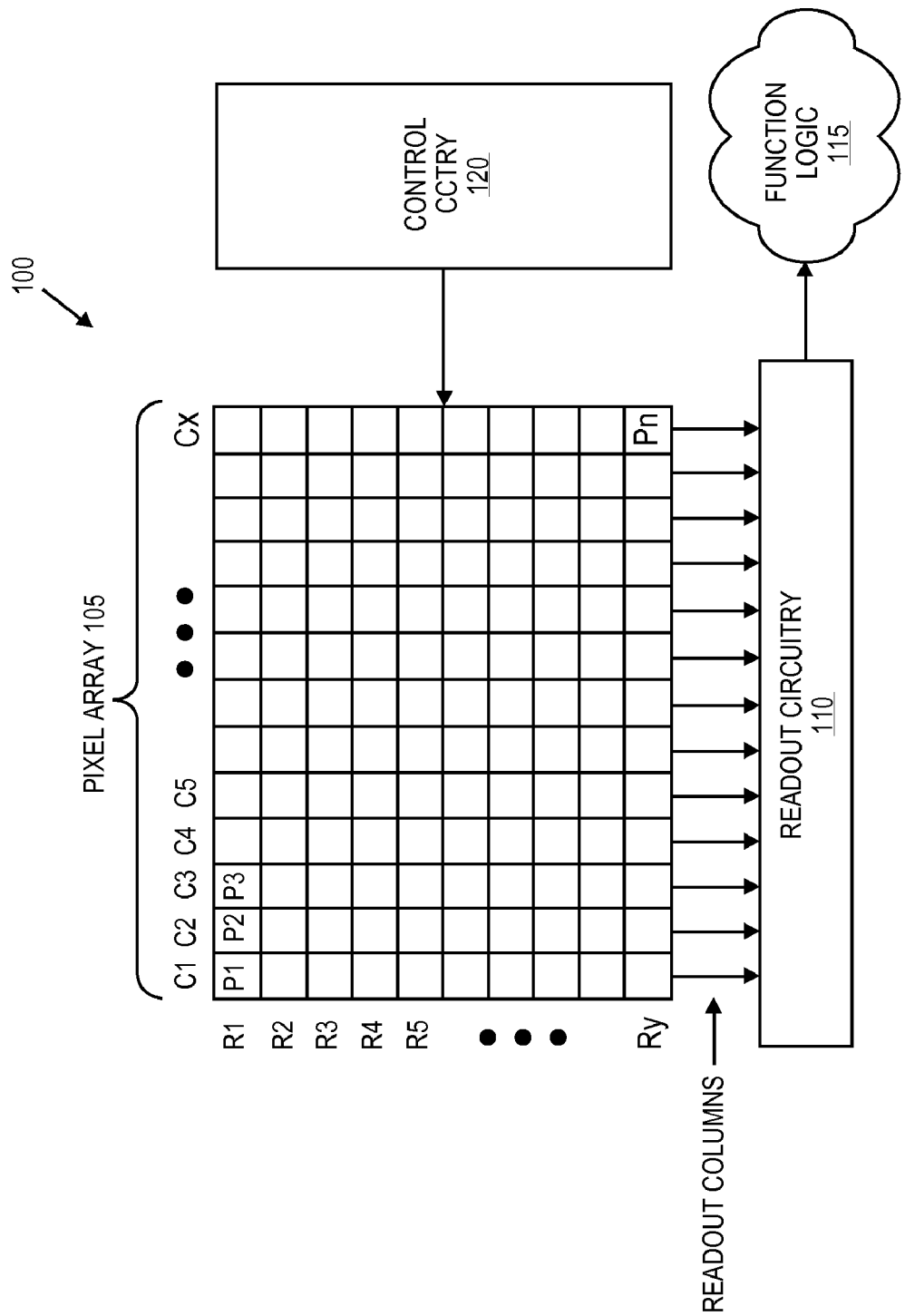
FIG. 1 is a block diagram illustrating a backside illuminated imaging sensor, in accordance with an embodiment of the invention.

FIG. 1 is a block diagram illustrating a backside illuminated imaging sensor 100, in accordance with an embodiment of the invention. The illustrated embodiment of imaging sensor 100 includes a pixel array 105, readout circuitry 110, function logic 115, and control circuitry 120.

Pixel array 105 is a two-dimensional ("2D") array of backside illuminated imaging sensors or pixels (e.g., pixels P1, P2 . . . , Pn). In one embodiment, each pixel is an active pixel sensor ("APS"), such as a complementary metal-oxide-semiconductor ("CMOS") imaging pixel. As illustrated, each pixel is arranged into a row (e.g., rows R1 to Ry) and a column (e.g., column C1 to Cx) to acquire image data of a person, place, or object, which can then be used to render a 2D image of the person, place, or object.

After each pixel has acquired its image data or image charge, the image data is readout by readout circuitry 110 and transferred to function logic 115. Readout circuitry 110 may include amplification circuitry, analog-to-digital conversion circuitry, or otherwise. Function logic 115 may simply storage the image data or even manipulate by applying post image effects (e.g., crop, rotate, remove red eye, adjust brightness, adjust contrast, or otherwise). In one embodiment, readout circuitry 110 may readout a row of image data at a time along readout column lines (illustrated) or may readout the image data using a variety of other techniques (not illustrated), such as a serial readout or a full parallel readout of all pixels simultaneously.

Control circuitry 120 is coupled to pixel array 105 to control operational characteristics of pixel array 105. For example, control circuitry 120 may generate a shutter signal for controlling image acquisition.

Figure 2:
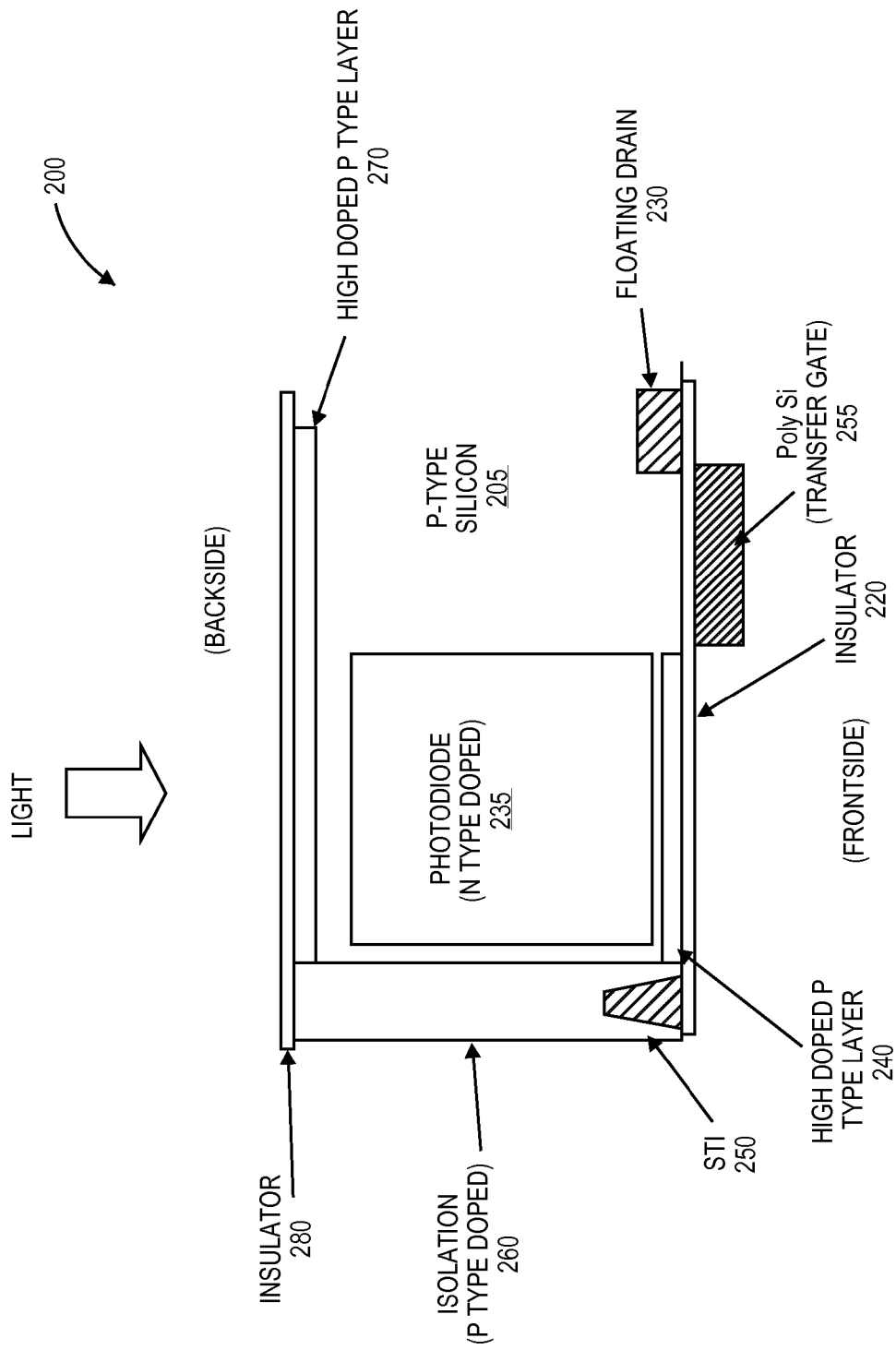
FIG. 2 is a cross-sectional view of a conventional imaging pixel of a backside illuminated imaging sensor.

FIG. 2 is a cross-sectional view of a conventional imaging pixel 200 of a backside illuminated imaging sensor. The illustrated embodiment of imaging pixel 200 shows a semiconductor substrate 205 that includes shallow trench isolations ("STI") 250, photodiode region 235, a floating drain 230, and a pinning layer 240. Also illustrated in FIG. 2 is a transfer gate 255 formed on insulator (gate oxide) 220.

In the illustrated embodiment of FIG. 2, photodiode region 235 is formed on a frontside of semiconductor substrate 205 (which is shown as being in the lower portions of FIG. 2) and is configured to receive light from a backside of semiconductor substrate 205. Photodiode region 235 is illustrated as a pinned photodiode by way of optional pinning layer 240. In an example, photodiode region 235 may be an unpinned photodiode or a partially pinned photodiode. Additionally, photodiode region 235 may be any photosensitive element, such as a photogate or photocapacitor. Furthermore, the term pixel as used herein is meant to encompass all pixel designs, including CCD pixels.

Also included in imaging pixel 200 is transfer gate 255 which is coupled to transfer charge that is accumulated in photodiode region 235 to floating drain 230. In one embodiment, transfer gate 255 is a polycrystalline silicon (i.e., polysilicon) structure.

As shown in FIG. 2, imaging pixel 200 includes a passivation layer (such as highly doped P+ layer 270) that can be formed using, for example, ion implantation. An insulator 280 can be formed on the backside of substrate 205. Insulator 280 is generally transparent to light.

During operation, incident light is received at the back surface of substrate 205 and passes through substrate 205 to be received by photodiode region 235. Photodiode region 235 then generates one or more electrical signals in response to the received light where these electrical signals are routed through peripheral circuitry. However, a portion of the light received at photodiode region 235 may continue propagating through the front surface (e.g., at insulator 220) of substrate 205. In some instances this light continues into one or more of the intermetal dielectric layers (not shown) and is reflected by the metal layers (not shown) back towards a different (e.g., adjacent) pixel, where this different pixel now generates a new electrical signal in response to the reflected light. Light reflecting back to an adjacent or different pixel in this manner is referred to herein as "optical crosstalk" and increases noise and reduces the quality in the resulting image produced by a pixel array.

Large leakage current occurs when a surface of the photodiode region 235 does not have a surface depletion area. For example, when the backside is not shielded by a P-type layer (such as layer 270), leakage current for the backside surface of the photodiode region 235 can noticeably degrade the quality of images captured using an unshielded photodiode.

A backside illuminated imaging sensor as disclosed herein includes a semiconductor having an imaging pixel that includes a photodiode region, an insulator, and a silicide reflective layer (not shown). The photodiode region is formed in the frontside of the semiconductor substrate. The insulation layer is formed on the backside of the semiconductor substrate. The transparent electrode is formed on the backside of the insulation layer. The transparent electrode allows light to be transmitted through a back surface of the semiconductor substrate such that when the transparent electrode is biased, carriers are formed in a region in the backside of the semiconductor substrate to reduce leakage current.

Figure 3:
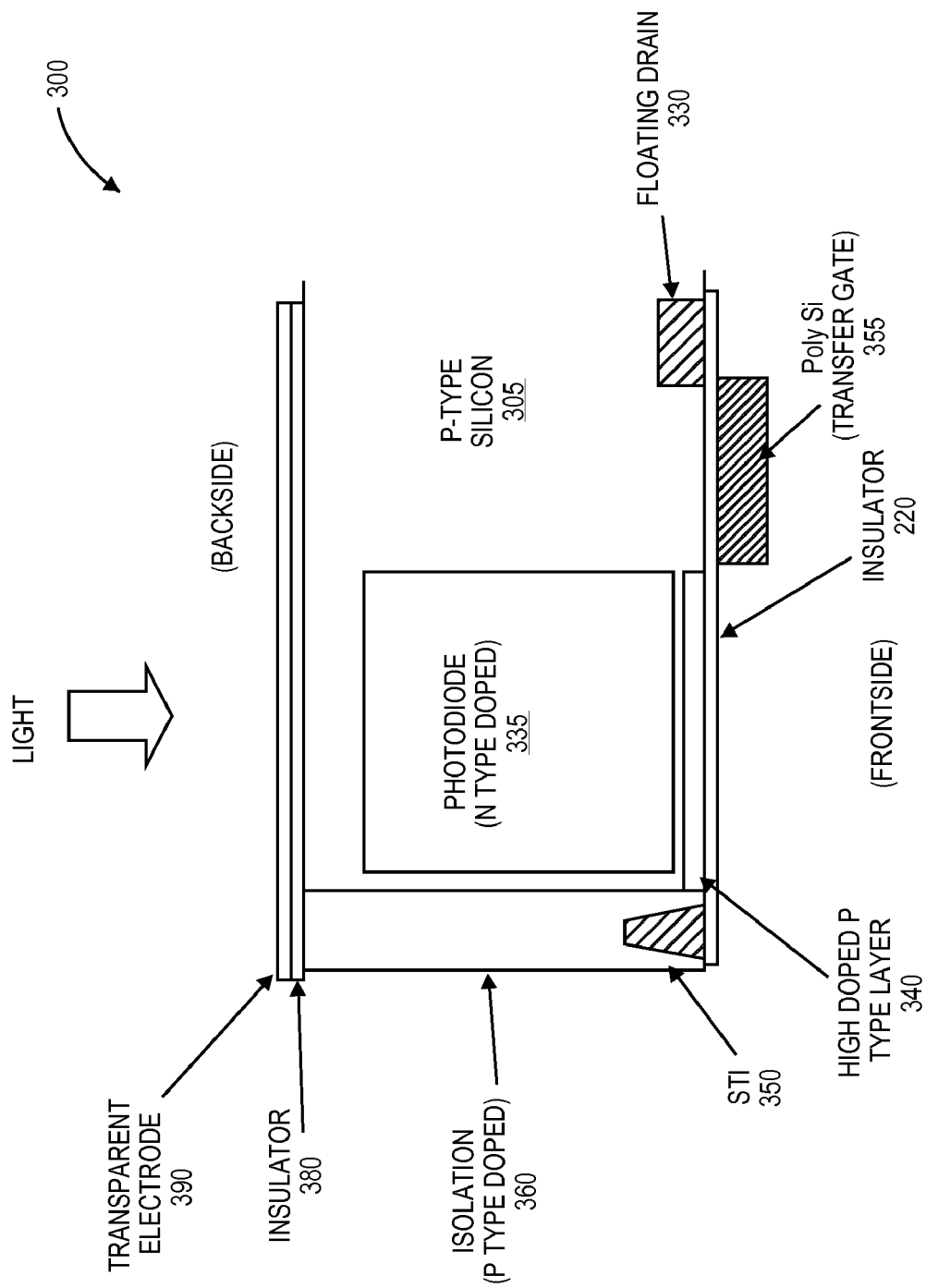
FIG. 3 is a cross-sectional view of a sample imaging pixel of a backside illuminated imaging sensor, in accordance with an embodiment of the invention.

FIG. 3 is a cross-sectional view of a sample imaging pixel 300 of a backside illuminated imaging sensor. The illustrated embodiment of imaging pixel 300 shows a semiconductor substrate 305 that includes shallow trench isolations ("STI") 350, photodiode region 335, a floating drain 330, and a pinning layer 340. Also illustrated in FIG. 3 is a transfer gate 355 formed on insulator (gate oxide) 320.

In the illustrated embodiment of FIG. 3, photodiode region 335 is formed generally in a frontside of semiconductor substrate 305 (which is shown as being in the lower portions of FIG. 3) and is configured to receive light from a backside of semiconductor substrate 305. Photodiode region 335 is illustrated as a pinned photodiode by way of optional pinning layer 340.

Also included in imaging pixel 300 is transfer gate 355 which is coupled to transfer charge that is accumulated in photodiode region 335 to floating drain 330. The charge is transferred through an active channel that is established when the transfer gate 355 is activated. In one embodiment, transfer gate 355 is a polycrystalline silicon (i.e., polysilicon) structure.

As shown in FIG. 3, imaging pixel 300 includes an active passivation layer formed on (and/or "in," throughout) the backside of substrate 305. The active passivation layer can include an insulator and an electrode. An insulator 380 can be formed on the backside of substrate 305 in a region that is over the photodiode region. Insulator 380 is generally transparent to light. A transparent electrode 390 is formed on the backside surface of insulator 380. The transparent electrode 390 and insulator 380 can be formed using relatively low temperature process steps that have little or no effect upon existing metal layers formed on the frontside. The transparent electrode 390 and insulator 380 can be formed upon a back side region in which reduced leakage is desired.

The transparent electrode 390 can be made using ITO, $SnO_2$, or other transparent conductive material. The insulator 380 can be formed using $SiO_2$, $Si_xN_y$, or other transparent insulator. The thickness of the transparent electrode and the insulator 380 can be chosen such that the transparent electrode 390 and insulator 380 can be used as an anti-reflective coating (as discussed below with respect to FIG. 4).

In operation, a negative voltage, such as −2.0 volts, is applied to the transparent electrode 390. As the negative voltage is applied to the transparent electrode holes are accumulated at the backside surface. The accumulated holes prevent the formation of a depletion region at the backside surface, which reduces leakage current flowing through the backside surface.

Figure 4:
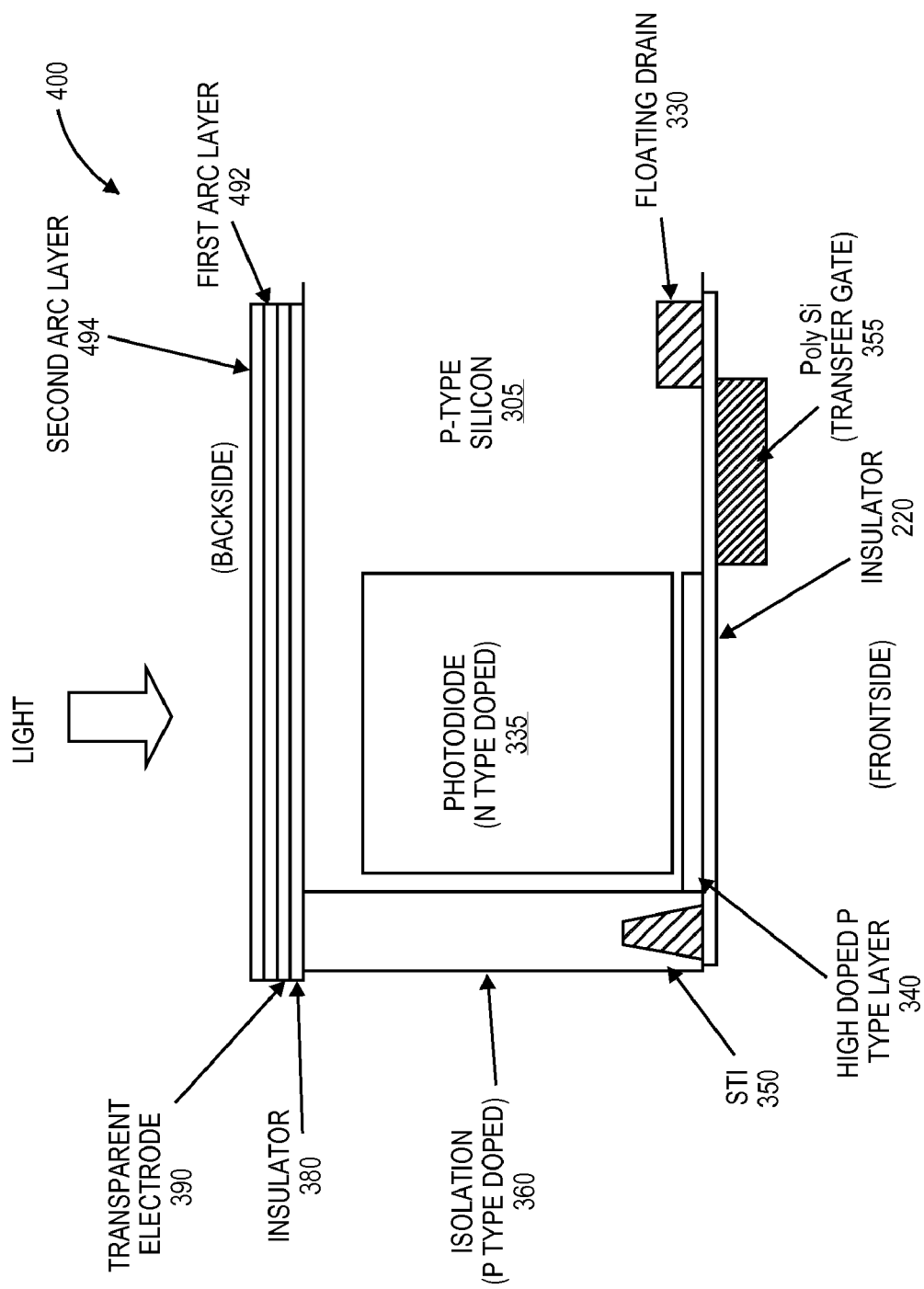
FIG. 4 is a block diagram illustrating a backside illuminated imaging sensor, in accordance with an embodiment of the invention.

FIG. 4 is a block diagram illustrating a backside illuminated imaging sensor 400, in accordance with an embodiment of the invention. Sensor 400 comprises first anti-reflective coating (ARC) layer 492 and a second ARC layer 494 formed in the backside of the semiconductor substrate. The anti-reflection coatings can be similar to those used on optical equipment such as camera lenses. The ARC layers can be formed by using a thin layer of dielectric material, having a thickness such that interference effects are caused. The interference effects cause a light wave reflected from the ARC top surface to be out of phase with the light wave reflected from the semiconductor surface under the ARC. Thus, the out-of-phase reflected waves destructively interfere with each another, which substantially reduces reflected energy and increases the quantum efficiency of the pixel.

The thickness of the anti-reflection coating can be chosen so that the wavelength in the dielectric material is about one quarter (and/or a fraction having a remainder of one-quarter or three-quarters) of the wavelength of the incoming light for a pixel. For a quarter wavelength anti-reflection coating of a transparent material with a refractive index $n_1$ and light incident on the coating with a free-space wavelength $\lambda_0$, the thickness $d_1$ which causes minimum reflection is calculated by:

$$d_1 = \frac{\lambda_0}{4n_1}.$$

The refractive index $n_1$ can be chosen to further minimize reflection when the refractive index is the geometric mean of that of the indices of refraction of bordering materials: $n_1 = \sqrt{n_0 n_2}$. For example, when an ARC is used between glass (silicon dioxide) and a semiconductor (silicon), $n_0=3.5$ and $n_2=1.5$, which yields $n_1=2.29$.

In accordance with the present disclosure, the ARC layer can be optimized for the wavelength of light for the color type of each pixel. For example, the ARC thickness for a blue light can be calculated using a wavelength of around 0.4 microns, which results in an ARC layer of around 0.050 microns (for an "internal" quarter wavelength of blue light) for silicon nitride (using an index of refraction of 2.0). For ease of manufacture (by allowing deeper layers), the ARC layer can be an odd integer multiple of the quarter wavelength (such that destructive interference occurs). For example, a depth of five times the quarter wavelength (0.250 microns) can be used as the depth for the ARC layer. Multiple ARC layers can be used with each pixel to improve sensitivity of each pixel with respect to selected wavelengths of light.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. A backside illuminated imaging sensor, comprising:
   a semiconductor substrate having a frontside and a backside, the semiconductor substrate having an imaging pixel that includes a photodiode region formed in the frontside of the semiconductor substrate;
   an insulation layer disposed on the backside of the semiconductor substrate in a region that is over the photodiode region; and
   a transparent conductive electrode disposed on the backside of the semiconductor substrate in the region that is over the photodiode region, wherein the insulation layer is disposed between the transparent conductive electrode and the semiconductor substrate, wherein the transparent conductive electrode allows light to be transmitted through the transparent conductive electrode to reach the photodiode region, wherein the transparent conductive electrode is configured to be biased to accumulate carriers in a portion of the backside of the semiconductor substrate along an interface between the semiconductor substrate and the insulation layer.

2. The sensor of claim 1 wherein the insulation layer is comprised by a first anti-reflective coating (ARC) layer.

3. The sensor of claim 2 wherein the first ARC layer is about 0.2 microns thick.

4. The sensor of claim 2 wherein the transparent conductive electrode is comprised by the first anti-reflective coating (ARC) layer.

5. The sensor of claim 4 wherein the first ARC layer is no more than 0.2 microns thick.

6. The sensor of claim 5 further comprising a second ARC layer having a thickness that is an odd integer multiple of a quarter wavelength of the light to be reflected.

7. The sensor of claim 6 wherein the first ARC layer and the second ARC layer each have a thickness that is an odd multiple of a quarter wavelength of the light to be reflected.

8. The sensor of claim 1 wherein the transparent conductive electrode comprises transparent conductive material selected from the group of ITO and $SnO_2$.

9. The sensor of claim 1 wherein the insulator comprises transparent insulative material selected from the group of $SiO_2$, and $Si_xN_y$.

10. The sensor of claim 1 further comprising a first anti-reflective coating (ARC) layer formed in the backside of the semiconductor substrate.

11. The sensor of claim 10 further comprising a second ARC layer formed in the backside of the semiconductor substrate.

12. The sensor of claim 1 wherein the transparent conductive electrode is configured to be biased with a voltage of about negative 2.0 volts to form carriers in a region in the backside of the semiconductor substrate.

13. A method for imaging, comprising:
    receiving light incident on a backside of a semiconductor substrate of an image sensor;
    transmitting light through a first anti-reflective coating (ARC) layer formed in the backside of the semiconductor substrate of the image sensor;
    passivating the backside of the semiconductor substrate of the image sensor by applying a voltage to a passivation layer, wherein the passivation layer comprises a transparent conductive electrode through which the light is transmitted prior to reaching a photosensitive region of the semiconductor substrate;
    passing the light through a second ARC layer, wherein a portion of the second ARC layer is used as an insulator for insulating the transparent conductive electrode from the semiconductor substrate, wherein the voltage accumulates carriers in a portion of the backside of the semiconductor substrate along an interface between the semiconductor substrate and the second ARC layer; and
    receiving the transmitted light in the photosensitive region of the semiconductor substrate of the image sensor, wherein a portion of the photosensitive region of the semiconductor substrate of the image sensor lies under the passivation layer.

14. The method of claim 13 wherein a portion of the first ARC layer is used to passivate the backside of the semiconductor substrate of the image sensor.

15. The method of claim 13 wherein the backside of the semiconductor substrate is passivated by applying a negative voltage of 2 volts to the transparent conductive electrode arranged over the portion of the photosensitive region of the semiconductor substrate.

16. A backside illuminated imaging pixel array, comprising:
    a semiconductor substrate having a frontside and a backside, the semiconductor substrate having imaging pixels wherein each pixel includes a photosensitive region formed in the frontside of the semiconductor substrate;
    an insulation layer disposed on the backside of the semiconductor substrate in a region that is over the photosensitive region, wherein the insulation layer is a first anti-reflective coating (ARC) layer; and
    a transparent conductive electrode disposed on the backside of the semiconductor substrate with the insulating layer disposed between the transparent conductive electrode and the semiconductor substrate, wherein the transparent conductive electrode allows light to be transmitted through the transparent conductive electrode to reach the photosensitive region in the semiconductor substrate, wherein the transparent conductive electrode is configured to be biased to accumulate carriers in a portion of the backside of the semiconductor substrate along an interface between the semiconductor substrate and the insulation layer, and wherein the transparent conductive electrode is a second ARC layer.

17. The array of claim 16 wherein the transparent electrode comprises transparent conductive material selected from the group of ITO and $SnO_2$.

18. The array of claim 17 wherein the insulator comprises transparent insulative material selected from the group of $SiO_2$, and $Si_xN_y$.

* * * * *